(12) United States Patent
Polcik et al.

(10) Patent No.: US 10,787,735 B2
(45) Date of Patent: Sep. 29, 2020

(54) COATING SOURCE

(71) Applicant: PLANSEE COMPOSITE MATERIALS GMBH, Lechbruck am See (DE)

(72) Inventors: Peter Polcik, Reutte (AT); Sabine Woerle, Pflach (AT)

(73) Assignee: Plansee Composite Materials GmbH, Lechbruck am See (DE)

( * ) Notice: Subject to any disclaimer, the term of this patent is extended or adjusted under 35 U.S.C. 154(b) by 273 days.

(21) Appl. No.: 15/546,290

(22) PCT Filed: Jan. 20, 2016

(86) PCT No.: PCT/EP2016/000092
§ 371 (c)(1),
(2) Date: Jul. 26, 2017

(87) PCT Pub. No.: WO2016/120002
PCT Pub. Date: Aug. 4, 2016

(65) Prior Publication Data
US 2018/0340254 A1 Nov. 29, 2018

(30) Foreign Application Priority Data
Jan. 26, 2015 (AT) .................................. GM 17/2015

(51) Int. Cl.
*B22F 3/14* (2006.01)
*C22C 1/05* (2006.01)
(Continued)

(52) U.S. Cl.
CPC ............ *C23C 14/3414* (2013.01); *B22F 3/12* (2013.01); *B22F 3/14* (2013.01); *B22F 3/15* (2013.01);
(Continued)

(58) Field of Classification Search
None
See application file for complete search history.

(56) References Cited

U.S. PATENT DOCUMENTS 5,234,487 A * 8/1993 Wickersham, Jr. ..... C22C 1/045
419/19
5,282,943 A 2/1994 Lannutti et al.
(Continued)

FOREIGN PATENT DOCUMENTS

AT 004240 U1 4/2001
AT 14346 U1 9/2015
(Continued)

*Primary Examiner* — Patricia L. Hailey
*Assistant Examiner* — Colette B Nguyen
(74) *Attorney, Agent, or Firm* — Laurence A. Greenberg; Werner H. Stemer; Ralph E. Locher

(57) ABSTRACT

A process for producing a coating source for physical vapour deposition provides the coating source with a target layer formed of an at least two-phase composite which contains a metallic phase and at least one further phase and a mechanical stabilizing layer which is joined to the target layer on one side of the target layer. A first powder mixture which corresponds in terms of its composition to the at least two-phase composite and a second powder mixture which corresponds in terms of its composition to the mechanical stabilizing layer are densified hot in superposed layers. A coating source for physical vapour deposition is also provided.

16 Claims, 3 Drawing Sheets

(51) Int. Cl.
  C23C 14/34    (2006.01)
  C23C 14/32    (2006.01)
  C22C 32/00    (2006.01)
  H01J 37/34    (2006.01)
  B22F 7/06     (2006.01)
  H01J 37/32    (2006.01)
  B22F 3/12     (2006.01)
  B22F 3/15     (2006.01)

(52) U.S. Cl.
  CPC ............ B22F 7/06 (2013.01); C22C 1/05 (2013.01); C22C 32/0078 (2013.01); C23C 14/325 (2013.01); H01J 37/32614 (2013.01); H01J 37/3426 (2013.01); H01J 37/3429 (2013.01); H01J 37/3491 (2013.01); B22F 2202/06 (2013.01); B22F 2202/07 (2013.01); B22F 2301/205 (2013.01); B22F 2301/40 (2013.01); B22F 2998/00 (2013.01); B22F 2999/00 (2013.01)

(56) References Cited

U.S. PATENT DOCUMENTS

| | | | | |
|---|---|---|---|---|
| 5,397,050 A | * | 3/1995 | Mueller | B22F 3/16 228/193 |
| 5,836,506 A | * | 11/1998 | Hunt | B23K 20/023 228/172 |
| 6,071,389 A | * | 6/2000 | Zhang | B23K 20/021 204/298.12 |
| 6,183,686 B1 | | 2/2001 | Bardus et al. | |
| 6,908,588 B2 | | 6/2005 | Wilhartitz et al. | |
| 2005/0104368 A1 | * | 5/2005 | Twigg | B23K 20/023 285/21.1 |
| 2005/0258033 A1 | | 11/2005 | Kumagai et al. | |
| 2012/0228131 A1 | | 9/2012 | Lo et al. | |
| 2012/0285826 A1 | | 11/2012 | Rozak et al. | |
| 2017/0200593 A1 | | 7/2017 | Gradinger et al. | |
| 2017/0309584 A1 | * | 10/2017 | Xie | H01L 25/50 |

FOREIGN PATENT DOCUMENTS

| | | |
|---|---|---|
| CN | 1268780 C | 8/2006 |
| CN | 101524754 A | 9/2009 |
| CN | 202193837 U | 4/2012 |
| JP | H06507674 A | 9/1994 |
| JP | 2004513244 A | 4/2004 |
| JP | 2005139539 A | 6/2005 |
| JP | WO2004011690 A | 11/2005 |
| TW | 200401834 A | 2/2004 |
| WO | 0022185 A1 | 4/2000 |
| WO | 0240735 A1 | 5/2002 |

* cited by examiner

COATING SOURCE

BACKGROUND OF THE INVENTION

Field of the Invention

The invention relates to a process for producing a coating source for physical vapour deposition, wherein the coating source includes at least a target layer formed of an at least two-phase composite which contains a metallic phase and at least one further phase, and a mechanical stabilizing layer which is joined to the target layer on one side of the target layer. The invention also relates to a coating source for physical vapour deposition having a target layer formed of an at least two-phase composite which contains a metallic phase and at least one further phase, where the metallic phase and all further phases present have melting points above 1000° C., and a mechanical stabilizing layer which is joined to the target layer on one side of the target layer.

In physical vapour deposition (PVD), starting material is brought into the vapour phase by physical processes and subsequently deposited on a substrate to be coated. Thus, in cathode atomization (sputtering) atoms are detached from a surface of a solid body (the sputtering target) by bombardment of the surface of the sputtering target by high-energy ions. The material which has been atomized in this way deposits, together with any additional elements present, on a substrate. In the arc process, cathode material is vaporized by means of a vacuum arc discharge and deposited on the substrate.

In the context of the present disclosure, the term coating source (hereinafter referred to as target for short) encompasses sputtering targets and arc cathodes.

In operation, targets are subjected to high thermal loads. The power densities are typically about 10 W/cm$^2$. To avoid overheating of the target, the heat has to be passed on to a heat sink, for example a cooling circuit. The target is also mechanically stressed as a result of treatment of the target with a coolant.

If the target itself does not have a sufficient thermal conductivity and/or does not have sufficient mechanical strength, the body forming the coating material can, as is known, be joined to a body having better thermal conductivity and/or mechanical strength. In this case, the total arrangement of coating material and additional body is referred to as target.

A number of methods of joining the body forming the coating material to an additional body are known from the prior art.

Thus, WO 00/22185 discloses, for example, a process in which the rear side of the coating material is joined by diffusion bonding to the front side of a backplate functioning as additional body. The coating material and the backplate are present as plate-like bodies before diffusion bonding. In this process, a sharp boundary is formed between the coating material and the backplate. In a metallographic examination, it is possible to see a sharply defined boundary between coating material and backplate, which are distinguished, for example, by different textures of the coating material and the backplate. When the target is subjected to mechanical stress, shear stresses arise and can lead to mechanical failure along the sharply defined interface.

U.S. Pat. No. 5,397,050 discloses a process by means of which a backplate present as a solid body is joined to a powder mixture which forms the coating material by hot isostatic pressing (HIP). Here too, there is a sharply defined interface, with the above-described disadvantages.

U.S. Pat. No. 5,282,943 discloses a process by means of which a heating source is firstly coated with an intermediate layer of aluminium and is then joined to the backplate by soldering. The soldering results in a phase having a lower melting point than the melting points of the remaining phases of the target, which reduces the thermal stability of the target.

WO 02/40735 by the applicant discloses a process for producing a coating source consisting of a target layer which contains an aluminium component in addition to one or more further components and a backplate which is joined to the target layer and is composed of a material having a better thermal conductivity than the target layer, where the target is produced by cold pressing of a mixture of the pulverulent individual components and subsequent forming, where the backplate is likewise pressed from pulverulent starting material together with the target components in superposed layered powder fractions and subsequently formed. This process is restricted to target layers consisting of materials having melting points of less than 1000° C., e.g. aluminium. Only in this way are low yield points obtained, which allows densification by cold pressing and forming by forging. The process cannot be applied to target layers consisting of materials having melting points above 1000° C., which, in particular, makes the processing of brittle materials such as silicon-rich titanium composites impossible.

The Austrian utility model AT GM 276/2014 by the applicant, which has an earlier priority and is not a prior publication, describes a process for producing a coating source for physical vapour deposition, wherein a mechanical stabilizing layer which is composed of copper or aluminium and has a particularly high thermal conductivity is applied by a highly kinetic spraying process to a target layer composed of a metallic composite. There is no formation of a spatially defined joining zone but instead an interface which can be quite uneven is formed owing to the different textures of the target layer and the mechanical stabilizing layer.

SUMMARY

It is an object of the present invention to provide a process for producing a coating source for physical vapour deposition which is improved compared to the prior art and provides such a coating source.

These objects are achieved by a process in which a first powder mixture which corresponds in terms of its composition to the at least two-phase composite and a second powder mixture which corresponds in terms of its composition to the mechanical stabilizing layer, are densified hot in superposed layers. These objects are also achieved by a coating source in which the target layer and the mechanical stabilizing layer are joined to one another via a joining zone which has an increasing concentration of particles of the further phase of the at least two-phase composite going from the mechanical stabilizing layer in the direction of the target layer without formation of an interface. Advantageous embodiments of the invention are defined in the dependent claims.

According to the invention, a first powder mixture which corresponds in terms of its composition to the at least two-phase composite and a second powder mixture which corresponds in terms of its composition to the mechanical stabilizing layer are thus densified hot in superposed layers.

For the purposes of the present invention, densified hot means that the powder mixtures are subjected to a thermally assisted densification step. The thermal assistance serves to promote the creep and sintering processes which lead to densification. The thermal assistance also promotes plastic deformation of the powders during densification.

The superposed layers are preferably hot pressed. For the purposes of the present disclosure, hot pressing is an axial mechanical densification process in which a powder is axially compressed in a pressing tool at temperatures which are such that sintering of the powder to form a solid body occurs. Axially means that, in contrast to isostatic pressing, the force is introduced along only one direction in space.

Hot pressing typically takes place at at least 40% of the homologous temperature (ratio of the prevailing temperature/melting point in kelvin). The heat required for sintering can be introduced indirectly via heating of the pressing tool and/or directly into the powder (e.g. by supply of electric current and/or inductive heating).

The first powder mixture and/or the second powder mixture do not necessarily have to be present as powder bed. It is considerable for the first and/or second powder mixture to be used in the form of an only predensified intermediate compact, with final densification and joining being effected by the hot densification.

This can occur in different variants:
- two powder mixtures are each pressed to give individual intermediate compacts and then densified hot
- only one of the powder mixtures is pressed to give an intermediate compact and this is subsequently densified hot with the second powder mixture
- the first and second powder mixtures are pressed to give an intermediate compact and subsequently densified hot (optionally with further powder mixtures)

The first powder mixture is preferably homogeneous. The second powder mixture can be homogeneous or gradated. In the case of a gradated configuration, a transition which is particularly advantageous from a thermal and mechanical point of view is obtained between the target layer and the mechanical stabilizing layer. If a gradated configuration is provided, it can be continuous or in layers.

The target layer and the mechanical stabilizing layer are preferably in contact over their full areas, i.e. over the entire cross section. However, it is also conceivable for the mechanical stabilizing layer to be, for instance, in the form of ribs or a grid on the target layer. For this purpose, the pressing tool is configured appropriately.

It is also possible to introduce additional reinforcing structures, optionally composed of different materials, into the stabilizing layer. For example, wires, rods or grids can be laid in the applied powder mixture of the future stabilizing layer.

The production process of the invention has a series of advantages:
- A sharply defined interface between the target layer and the mechanical stabilizing layer is avoided, so that the disadvantages of such an interface which have been described in respect of the prior art do not occur. As a result of the process of the invention, there is no interface but instead a spatially extended joining zone which has an increasing concentration of particles of the further phase of the at least two-phase composite going from the mechanical stabilizing layer in the direction to the target layer without formation of a sharp interface.
- With regard to the soldering described at the outset (as described in U.S. Pat. No. 5,282,943), there is no thermal weakening due to the low-melting soldering material of the coating source, so that a coating source produced according to the invention can be used at much higher powers in PVD operation.

The process of the invention makes it possible to use brittle materials for the target layer, for which a process as per WO 02/40735 would not be able to be used.

Examples of hot densification of the superposed layers of the first and second powder mixtures are, apart from hot pressing, spark plasma sintering (SPS) and field-assisted-sintering technology (FAST). In each case, the superposed layers can be supplied with an electric current and/or inductively heated during pressing.

Examples of materials which are suitable for the first powder mixture or for the target layer are titanium-based composites or space-centred cubic materials having a brittle-ductile transition, e.g. chromium-based, molybdenum-based, niobium-based, tantalum-based or tungsten-based composites.

Examples of materials which are suitable for the second powder mixture or for the mechanical stabilizing layer are
- pure metals such as titanium, iron, nickel, copper
- alloys of the abovementioned pure metals
- composites based on the abovementioned pure metals or the abovementioned alloys.

The at least two-phase composite forming the target layer contains a metallic phase and at least one further phase. The metallic phase can be in the form of a metallic matrix in which the further phase, for instance in the form of particles, is embedded (matrix=enveloping or continuous phase). It may be remarked that the proportion by volume of such a matrix can quite well also be below 50%. The further phase can be formed by a metallic, intermetallic or ceramic phase.

Preference is given to the material for the metallic phase of the at least two-phase composite and the material of the mechanical stabilizing layer consisting to an extent of at least 80 at. % of the same metal.

For example, the metallic phase of the at least two-phase composite and the mechanical stabilizing layer can be formed by the same alloy.

It is also possible for the same material, optionally with small additions of alloying elements and/or in different purity, to be used for the metallic phase of the at least two-phase composite and for the mechanical stabilizing layer.

It is likewise conceivable for the metallic phase of the at least two-phase composite and the mechanical stabilizing layer to consist of the same metallic material.

A particularly advantageous transition from a thermal and mechanical point of view between the target layer and the mechanical stabilizing layer is achieved in this way. Powders having a lower purity than is necessary for the target layer can optionally be used for the mechanical stabilizing layer. It is also possible to use alloy powders, for example in order to increase the strength of the stabilizing layer.

Particles of the further phase can likewise be embedded in the mechanical stabilizing layer. This can, for example, be advantageous for matching physical and/or mechanical properties of the stabilizing layer to the target layer. Thus, it can be provided for the mechanical stabilizing layer itself to consist of an at least two-phase composite.

PRODUCTION EXAMPLE 1

To produce a titanium-silicon-containing coating source having a stabilizing layer composed of titanium, the following procedure is employed.

mixing of titanium (Ti) and TiSi$_2$ (titanium disilicide) powders to give a titanium-silicon (TiSi) precursor as first powder mixture filling of a pressing tool (here a graphite-SPS tool) with pure titanium powder as second powder mixture filling of the previously half-filled tool with the TiSi precursor densification of the two-layer assembly by SPS in the temperature range 900-1400° C.

final mechanical working by cutting machining to give targets

The term "TiSi precursor" for a precursor composed of titanium- and silicon-containing species does not mean that titanium and silicon are introduced in a molar ratio of 1:1. In other words, "TiSi" is not to be understood as a chemical formula here.

The resulting target has the following properties:

Two-layer construction composed of a brittle TiSi target layer and a ductile backplate composed of titanium as mechanical stabilizing layer The ratio of the coefficients of thermal expansion of the composite forming the target layer and of the stabilizing layer is in the range from 0.5 to 2.0, preferably in the range from 0.75 to 1.33.

The transition from target layer to stabilizing layer is continuous with formation of a joining zone but without formation of an interface as occurs in the case of diffusion bonding or soldering Further advantages and distinguishing aspects of the invention will be discussed with the aid of the figures.

DESCRIPTION OF THE INVENTION

Figure 1:
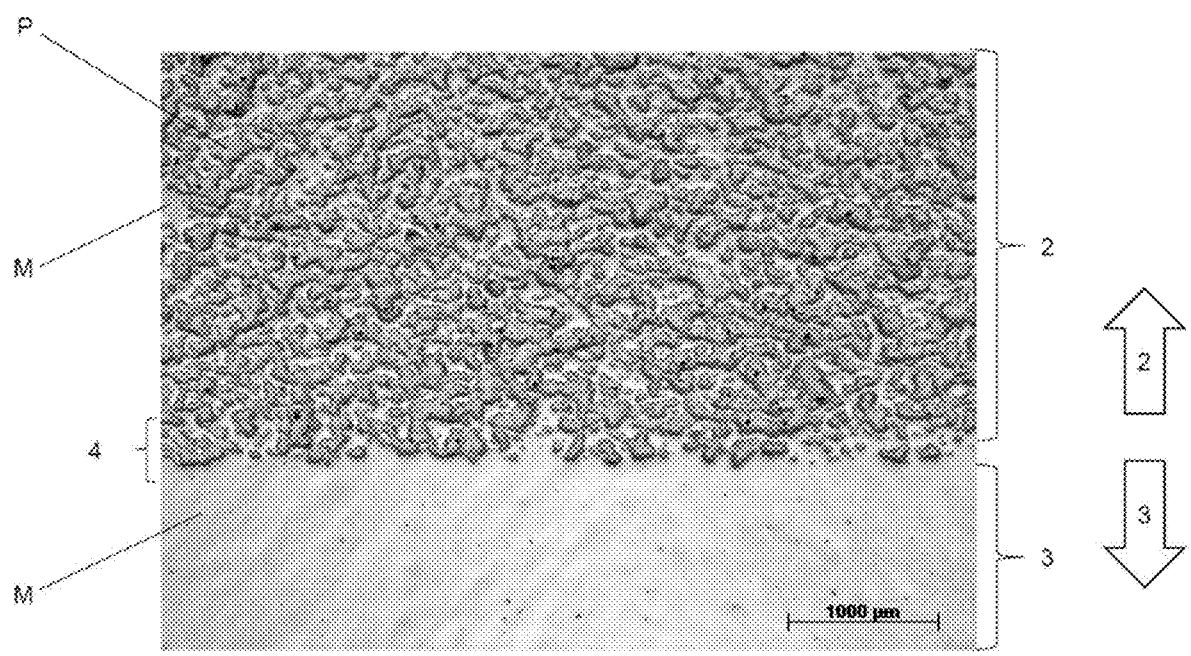
FIG. 1 a metallographic polished section,
FIG. 2a and FIG. 2b a further metallographic polished section with grain boundary etching
FIG. 3 a coating source (target)
FIG. 4 a pressing tool.

FIG. 1 shows a metallographic polished section of a joining zone 4 of a coating source 1 according to the invention, via which a target layer 2 (in this case TiSi 70/30 at. %) and a mechanical stabilizing layer 3 (in this case titanium) are joined.

The figure naturally shows only sections of the target layer 2, of the joining zone 4 and of the stabilizing layer 3. The arrows at the right-hand margin of the picture indicate the orientation of the image section shown. The arrow having the reference symbol 2 points in the direction in which the target layer 2 extends. The arrow having the reference symbol 3 points in the direction in which the stabilizing layer 3 extends.

The widths of the brackets characterizing the respective layers do not have to correspond to the actual layer thicknesses but instead serve for identification of the respective layers.

The further phase P of the at least two-phase composite embedded in the metallic phase M as first phase of the target layer 2 can clearly be seen. The metallic phase M thus forms the matrix here. In the example shown, the phase M of the target layer 2 corresponds to the stabilizing layer 3. In other words, the mechanical stabilizing layer 3 consists of the same material which forms the phase M of the target layer 2.

The further phase P in the present example is a titanium silicide and is embedded in a titanium matrix formed by the metallic phase M.

Figure 2A:
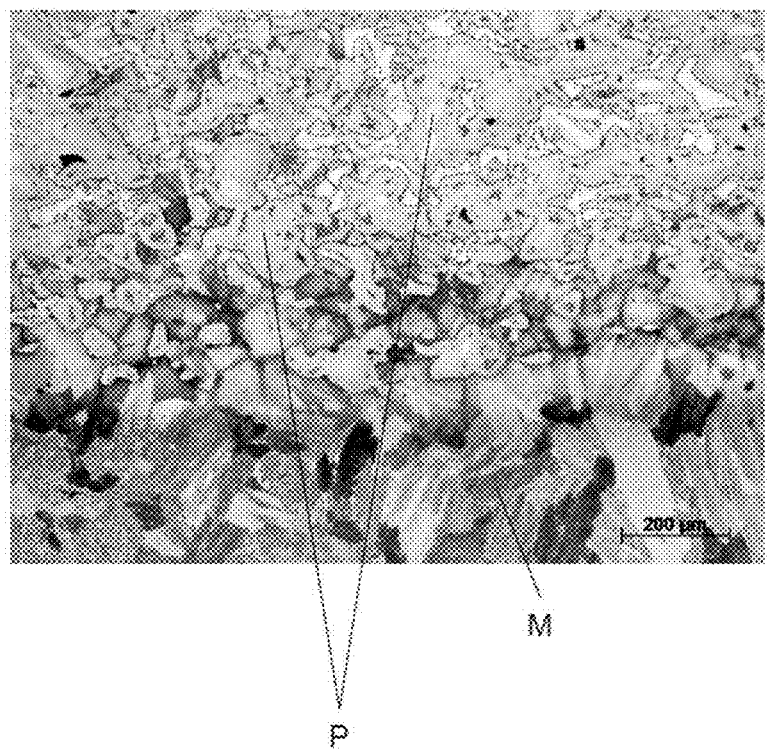
Figure 2B:
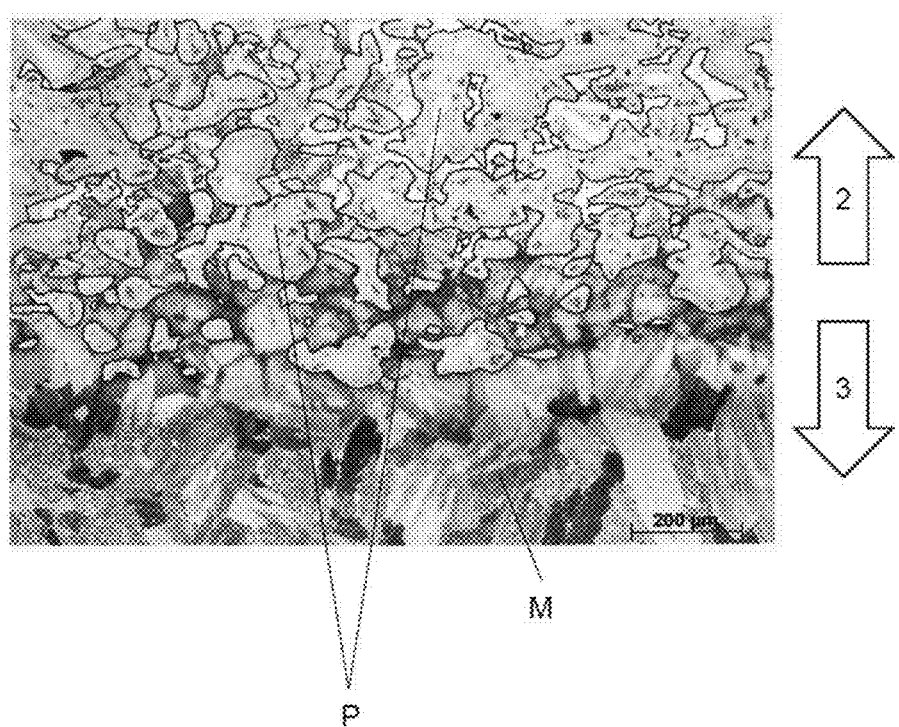

FIG. 2a and FIG. 2b in each case show a metallographic polished section of the joining zone 4 of a coating source 1 according to the invention with grain boundary etching for the example of a TiSi 70/30 at. % material on a titanium stabilizing layer 3.

The grain boundaries are made visible by grain boundary etching. It is therefore possible to see the shape and orientation of the individual grains here. Note may be taken of the size scale, recognizable from the size bar, which is different from FIG. 1.

The images in FIGS. 2a and 2b differ in that in FIG. 2b the grain boundaries of the TiSi grains, which correspond to the further phase P, have been outlined with a bold black line to distinguish them better. Otherwise, FIG. 2b corresponds to FIG. 2a.

The orientation of the metallographic polished section is made clear by the arrows at the right-hand margin of the page. The arrow having the reference symbol 2 points in the direction in which the target layer 2 extends. The arrow having the reference symbol 3 points in the direction in which the stabilizing layer 3 extends.

The individual TiSi grains (phase P) are embedded in the metallic phase M. It may be remarked that the lines of the reference symbols are directed by way of example at individual grains of the phase P or of the metallic phase M. Naturally, the phase P and the metallic phase M consist of many grains.

In the present materials system, the rather roundish grains of the phase P can be distinguished readily in respect of their shape from the angular grains of the metallic phase M.

It can be seen that the microstructure of the stabilizing layer 3 goes over continuously into the metallic phase M of the target layer 2. The individual Ti grains in the stabilizing layer 3 and also in the metallic phase M of the target layer 2 can be recognized by the characteristic twinning in the interior of the grains. In the joining zone, an increasing concentration of particles of the further phase P (here the TiSi grains) going from the material of the stabilizing layer 3 in the direction to the target layer 2 can be seen.

Figure 3:
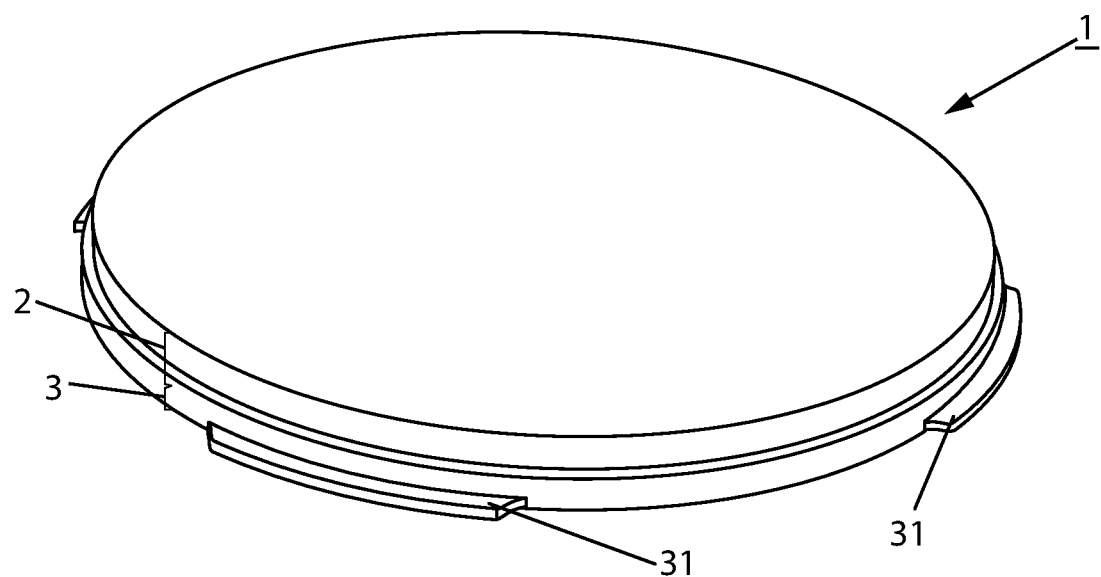

FIG. 3 shows a perspective view of a coating source 1 according to the invention. In the example shown, the stabilizing layer 3 can be distinguished visually from the target layer 2. The step on the circumference in the coating source 1 here does not correspond to the transition of target layer 2 into the stabilizing layer 3. Bayonet projections 31, which aid positioning of the coating source 1 in a coating plant, can be seen on the stabilizing layer 3.

Figure 4:
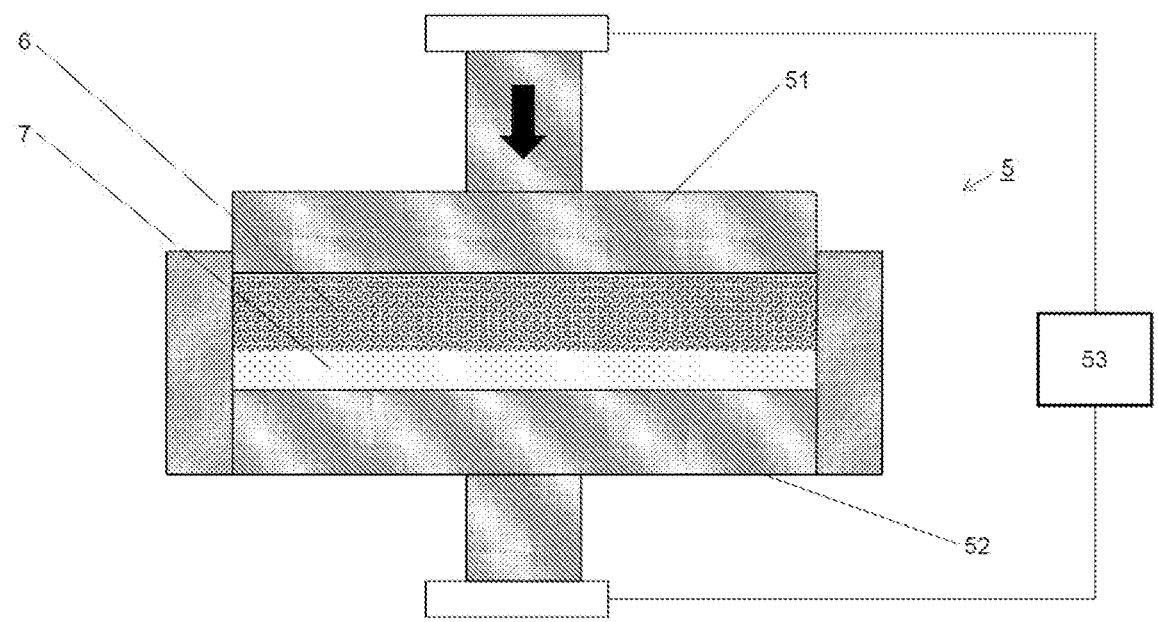

FIG. 4 schematically shows a pressing tool 5 for producing a blank for a coating source 1 by the process of the invention. The pressing tool 5 has an upper punch and a lower punch (51, 52) and a heating device 53.

A first powder mixture 6 which corresponds in terms of its composition to the target layer 2 and a second powder mixture 7 which corresponds in terms of its composition to the mechanical stabilizing layer 3 are present as layers in the pressing tool 5. Densification is effected axially, as indicated by the arrow.

LIST OF REFERENCE SYMBOLS USED

1 Coating source
2 Target layer
3 Stabilizing layer
31 Bayonet projection

4 Joining zone
5 Pressing tool
51 Upper punch
52 Lower punch
53 Heating device
6 first powder mixture
7 second powder mixture
M Metallic phase
P further phase

The invention claimed is:

1. A process for producing a coating source for physical vapour deposition, the process comprising the following steps:
    providing a first powder mixture having a composition corresponding to a target layer formed of an at least two-phase composite containing a metallic phase and at least one further phase;
    providing a second powder mixture having a composition corresponding to a mechanical stabilizing layer being joined to one side of the target layer at a joining zone having an increasing concentration of particles of the at least one further phase of the at least two-phase composite going from the mechanical stabilizing layer in a direction toward the target layer without formation of an interface; and
    hot-densifying the first and second powder mixtures in superposed layers.

2. The process according to claim 1, which further comprises carrying out the hot-densifying step by hot-pressing the superposed layers.

3. The process according to claim 1, which further comprises carrying out the hot-densifying step by at least one of supplying the superposed layers with an electric current or inductively heating the superposed layers.

4. The process according to claim 1, which further comprises carrying out at least one of the steps of providing the first or second powder mixture as only a predensified intermediate compact, and effecting a final densification and joining by the hot-densifying step.

5. The process according to claim 1, which further comprises using titanium or a titanium alloy as the metallic phase of the at least two-phase composite.

6. The process according to claim 1, which further comprises providing a material for the metallic phase of the at least two-phase composite and a material of the mechanical stabilizing layer as the same metal to an extent of at least 80 at.%.

7. The process according to claim 1, which further comprises providing the further phase in a proportion of more than 25 percent by volume of the at least two-phase composite.

8. The process according to claim 5, which further comprises using an element other than at least one of titanium or a titanium compound as the further phase.

9. The process according to claim 1, which further comprises placing the first and second powder mixtures above one another with full areas of the first and second powder mixtures adjoining one another.

10. A coating source for physical vapour deposition, the coating source comprising:
    a target layer formed of an at least two-phase composite containing a metallic phase and at least one further phase, said metallic phase and all further phases present having melting points above 1000° C.;
    a mechanical stabilizing layer; and
    a joining zone joining said mechanical stabilizing layer to one side of said target layer, said joining zone having an increasing concentration of particles of said at least one further phase of said at least two-phase composite going from said mechanical stabilizing layer in a direction toward said target layer without formation of an interface.

11. The coating source according to claim 10, wherein said metallic phase of said at least two-phase composite includes titanium or a titanium alloy.

12. The coating source according to claim 10, wherein said metallic phase of said at least two-phase composite and said mechanical stabilizing layer are formed of materials being the same metal to an extent of at least 80 at.%.

13. The coating source according to claim 10, wherein said further phase is present in a proportion of more than 25 percent by volume of said at least two-phase composite.

14. The coating source according to claim 11, wherein said further phase is formed of an element other than at least one of titanium or a titanium compound.

15. The coating source according to claim 10, wherein said mechanical stabilizing layer is formed of the same metallic material forming said metallic phase of said target layer and is at least substantially free of particles of said further phase of said at least two-phase composite.

16. The coating source according to claim 10, wherein said mechanical stabilizing layer is formed of an at least two-phase composite.

* * * * *